(12) United States Patent
Tomar et al.

(10) Patent No.: US 7,724,051 B2
(45) Date of Patent: May 25, 2010

(54) DLL CIRCUIT, SEMICONDUCTOR DEVICE USING THE SAME, AND METHOD FOR CONTROLLING DLL CIRCUIT

(75) Inventors: Bhawna Tomar, Bangalore (IN); Krishman S. Rengarajan, Bangalore (IN); Shetti Shanmukheshwara Rao, Bangalore (IN)

(73) Assignee: Elpida Memory, Inc., Chuo-ku, Tokyo (JP)

( * ) Notice: Subject to any disclaimer, the term of this patent is extended or adjusted under 35 U.S.C. 154(b) by 0 days.

(21) Appl. No.: 12/222,808

(22) Filed: Aug. 15, 2008

(65) Prior Publication Data

US 2009/0189658 A1 Jul. 30, 2009

(30) Foreign Application Priority Data

Jan. 25, 2008 (IN) .................. 0206/CHE/2008

(51) Int. Cl.
*H03L 7/06* (2006.01)
(52) U.S. Cl. ...................... 327/158; 327/149
(58) Field of Classification Search .......... 327/158, 327/149, 156, 147
See application file for complete search history.

(56) References Cited

U.S. PATENT DOCUMENTS

| | | | | |
|---|---|---|---|---|
| 4,868,908 A * | 9/1989 | Pless et al. | ........... | 323/267 |
| 5,477,182 A * | 12/1995 | Huizer | ........... | 327/261 |
| 6,351,191 B1 * | 2/2002 | Nair et al. | ........... | 331/57 |
| 6,815,986 B2 * | 11/2004 | Roy et al. | ........... | 327/149 |
| 6,819,190 B2 * | 11/2004 | Pearce et al. | ........... | 331/57 |
| 6,937,076 B2 * | 8/2005 | Gomm | ........... | 327/158 |
| 7,138,845 B2 * | 11/2006 | Lin | ........... | 327/277 |
| 7,151,397 B2 * | 12/2006 | Andrasic et al. | ........... | 327/276 |
| 7,239,188 B1 * | 7/2007 | Xu et al. | ........... | 327/156 |
| 7,274,239 B2 * | 9/2007 | Lin | ........... | 327/277 |
| 7,319,351 B2 * | 1/2008 | Zhang et al. | ........... | 327/158 |
| 7,336,752 B2 * | 2/2008 | Vlasenko et al. | ........... | 375/376 |
| 7,388,412 B2 * | 6/2008 | Jung | ........... | 327/116 |
| 7,449,927 B2 * | 11/2008 | Kim | ........... | 327/156 |
| 7,535,271 B2 * | 5/2009 | Kizer | ........... | 327/156 |
| 2004/0125905 A1 * | 7/2004 | Vlasenko et al. | ........... | 375/376 |
| 2006/0273836 A1 * | 12/2006 | Lin | ........... | 327/158 |
| 2007/0040594 A1 * | 2/2007 | Jung | ........... | 327/156 |
| 2007/0069779 A1 * | 3/2007 | Kim | ........... | 327/158 |
| 2008/0089459 A1 * | 4/2008 | Vlasenko et al. | ........... | 375/376 |
| 2009/0045857 A1 * | 2/2009 | Kim | ........... | 327/158 |
| 2009/0167379 A1 * | 7/2009 | Mobin et al. | ........... | 327/149 |

OTHER PUBLICATIONS

John C. Maneatis "Low-Jitter Process-Independent DLL and PLL Based on Self-Biased Techniques", IEEE JSSC, vol. 31, No. 11, Nov. 1996 (pp. 1723-1731).
Se Jun Kim, Sang Hoon Hong, Jae-Kung Wee, Joo Hwan Cho, Pil Soo Lee, Jin Hong Ahn, and Jin Yong Chung "A Low-Jitter Wide-Range Skew-Calibrated Dual-Loop DLL Using Antifuse Circuitry for High-Speed DRAM", IEEE JSSC, vol. 37, No. 6, Jun. 2002 (pp. 726-733).

* cited by examiner

*Primary Examiner*—Lincoln Donovan
*Assistant Examiner*—Adam D Houston
(74) *Attorney, Agent, or Firm*—McGinn IP Law Group, PLLC

(57) ABSTRACT

A DLL circuit includes a delay line for delaying a clock signal, the delay line including a plurality of cascade-connected variable delay elements, the variable delay elements having a differential circuit structure in which a delay value thereof can be varied by a bias current, a first controller for setting the bias current, and a second controller for selecting an output-producing variable delay element from the plural its of the variable delay elements.

14 Claims, 6 Drawing Sheets

DLL CIRCUIT, SEMICONDUCTOR DEVICE USING THE SAME, AND METHOD FOR CONTROLLING DLL CIRCUIT

TECHNICAL FIELD

The present invention relates to a DLL (delayed locked loop) circuit and a semiconductor device provided therewith; and particularly to a DLL circuit that can handle clock signals having a wide range of frequencies, and to a semiconductor device provided with this circuit. The present invention also relates to a method for controlling the DLL circuit.

BACKGROUND OF THE INVENTION

Recently, synchronous memory for carrying out operations synchronized with a clock signal has been used as the main memory in personal computers and the like. With DDR (double data rate) synchronous memory, which is one type of synchronous memory, input/output data must be accurately synchronized with an external clock. Therefore, it is necessary to generate an internal clock synchronized with the external clock by using a DLL circuit.

FIG. 6 is a circuit diagram of an ordinary DLL circuit.

As shown in FIG. 6, the ordinary DLL circuit includes a delay line 20 having a plurality of cascade-connected delay elements 10. The external clock signal CLK is supplied to the first stage delay element 10a. The output-producing delay element 10 is selected from the plurality of delay elements 10 by a selector 30. Therefore, the amount by which the internal clock signal LCLK is delayed with respect to the external clock signal CLK increases as the stage of the selected delay element increases.

The selection operation carried out by the selector 30 is controlled by a phase comparator 40. The phase comparator 40 is a circuit for comparing the phase of the external clock signal CLK and the phase of the internal clock signal LCLK, which passes through a replica buffer 50. In the phase comparator 40, when the phase of the internal clock signal LCLK is delayed with respect to that of the external clock signal CLK, the phase of the internal clock signal LCLK should be advanced, and a lower stage delay element 10 will be selected by the selector 30. On the other hand, when the phase of the internal clock signal LCLK is advanced with respect to that of the external clock signal CLK, the phase of the internal clock signal LCLK should be delayed, and a higher stage delay element 10 will be selected by the selector 30.

However, the frequency of the external clock signal CLK varies according to the specifications of the end product and the operation mode. Therefore, a demand has arisen for a DLL circuit that is compatible with certain frequency bands. However, in order for compatibility to be provided over a wide clock frequency range, the number of stages of the delay elements 10 constituting the delay line 20 must be increased, and the delay produced by a single delay element 10 must be set to a low value. Therefore, when an attempt is made to increase the compatible frequency range, a problem arises in that the area used by the DLL circuit on the chip increases.

On the other hand, since the frequencies of the clock signals are extremely high, a demand has arisen in recent years for an increase in the quality of the clock signal transmitted by the delay line. Using differential circuits as the delay elements 10 constituting the delay line 20 is an effective way to enhance the quality of the clock signal transmitted by the delay line (see John G. Maneatis, "Low-Jitter Process-Independent DLL and PLL Based on Self-Biased Techniques", IEEE JSSC, Vol. 31 No. 11, November 1996).

A dual-loop DLL circuit having a feedback loop using a positive signal and feedback loop using an inverted clock signal has been proposed as a method for increasing signal quality (see Se Jun Kim, Sang Hoon Hong, Jae-Kyung Wee, Joo Hwan Cho, Pil Soo Lee, Jin Hong Ahn, and Jin Yong Chung, "A Low-Jitter Wide-Range Skew-Calibrated Dual-Loop DLL Using Antifuse Circuitry for High-Speed DRAM", IEEE JSSC, Vol. 37 No. 6, June 2002).

However when differential circuits are used as the delay elements 10, the scale of the circuit will be further increased. Therefore, when an attempt is made to widen the compatible frequency range and increase the quality of the clock signal transmitted by the delay line, problems have occurred in that the area used on the chip is considerably increased.

SUMMARY OF THE INVENTION

It is therefore an object of the present invention is to provide a DLL circuit wherein the area used on the chip is reduced, the circuit is compatible with a wide range of clock frequencies, and the quality of the clock signal transmitted by the delay line is increased; and to provide a semiconductor device provided with the circuit.

Another object of the present invention is to provide a method for controlling the DLL circuit.

A DLL circuit according to the present invention comprising: a delay line for delaying a clock signal, the delay line including a plurality of cascade-connected variable delay elements, the variable delay elements having a differential circuit structure in which a delay value thereof can be varied by a bias current; and a control circuit including a first controller for setting the bias current and a second controller for selecting an output-producing variable delay element from the plurality of the variable delay elements.

A semiconductor device according to the present invention comprising the DLL circuit mentioned above and an output buffer, the output buffer outputting data in synchrony with an internal clock signal delayed by the delay line.

A method for controlling the above mentioned DLL circuit according to the present invention comprising: a first step for setting the bias current on a basis of a frequency of the clock signal; and a second step for selecting the output-producing variable delay element from the plurality of the variable delay elements on a basis of a phase difference between the clock signal and an internal clock signal delayed by the delay line.

According to the present invention, the delay line is configured using variable delay elements; therefore, a wide range of clock frequencies can be addressed using a small number of stages. Furthermore, the variable delay elements used in the present invention have a differential circuit structure, and it is therefore possible to increase the quality of the clock signal transmitted by the delay line. The delay value of the delay elements is varied by controlling the bias current. The range in which the delay value may be varied is therefore extremely wide.

The variable delay elements preferably have variable bias circuits including a plurality of bias transistors connected in parallel, and a switching circuit for switching an energized bias transistor. In this case, a first controller can adjust the delay value by controlling the switching circuit. The first controller can also adjust the delay value by varying the bias current supplied to the bias transistor gate.

According to the present invention, it is possible to provide a DLL circuit wherein the area used on the chip is reduced; the circuit is compatible with a wide range of clock frequencies; and the quality of the clock signal transmitted by the delay line is increased; and a semiconductor device provided with the circuit. It is also possible to provide a method for controlling this DLL circuit.

BRIEF DESCRIPTION OF THE DRAWINGS

The above and other objects, features and advantages of this invention will become more apparent by reference to the following detailed description of the invention taken in conjunction with the accompanying drawings, wherein.

DETAILED DESCRIPTION OF THE EMBODIMENTS

Preferred embodiments of the present invention will now be explained in detail with reference to the drawings.

Figure 1:
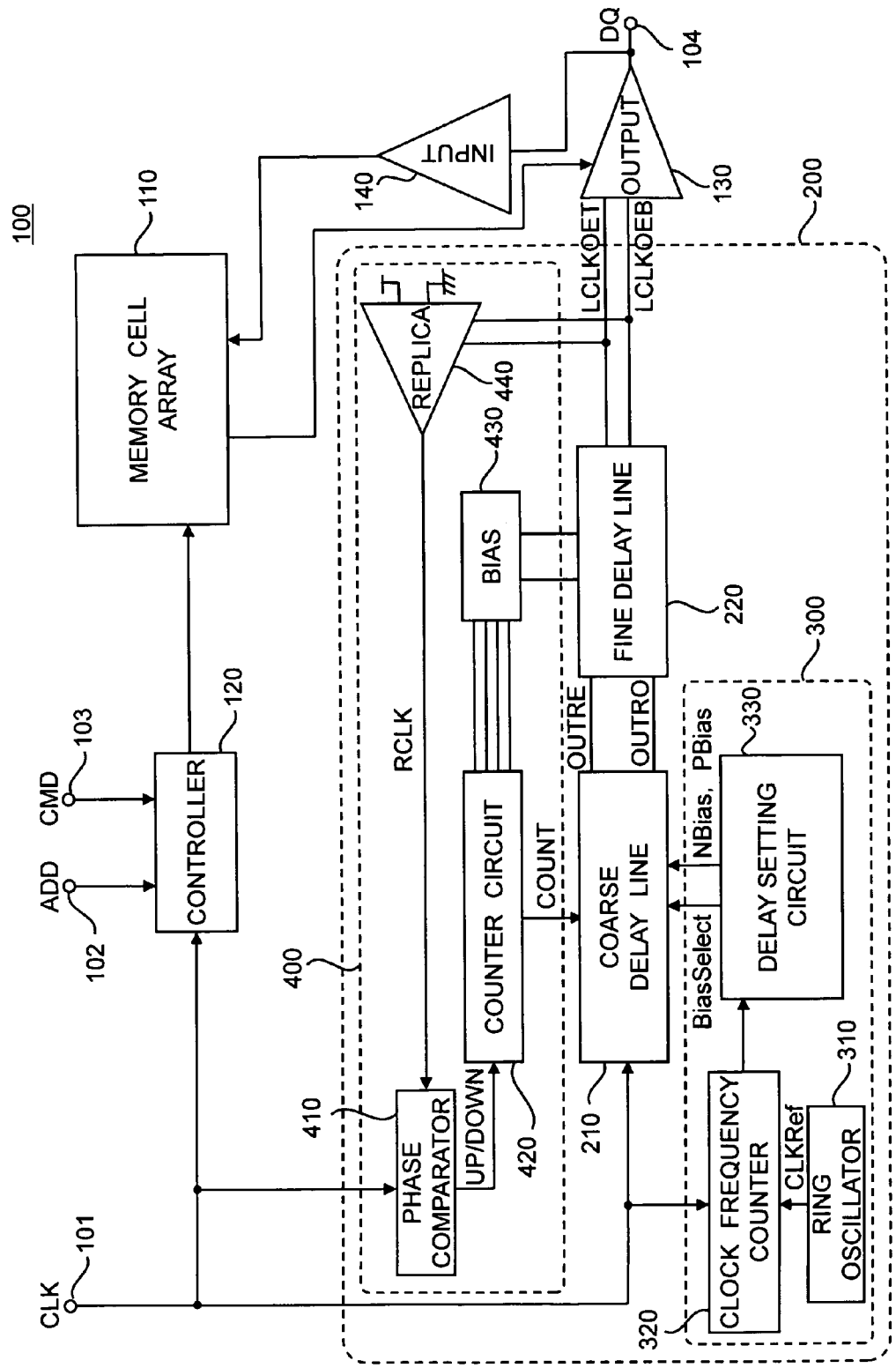
FIG. 1 is a block diagram of a semiconductor device provided with a DLL circuit according to a preferred embodiment of the present invention.

FIG. 1 is a block diagram of a semiconductor device provided with a DLL circuit according to a preferred embodiment of the present invention. FIG. 1 shows an example in which the DLL circuit according to the present embodiment is incorporated in a DRAM used in a personal computer, a server or the like.

A semiconductor device 100 shown in FIG. 1 has a memory cell array 110; a controller 120 for performing access control for the memory cell array 110; an output buffer 130 for outputting read data from the memory cell array 110 to an external devices; an input buffer 140 for receiving write data inputted from the external devices; and a DLL circuit 200 for synchronizing the output timing of the read data from the output buffer 130 with an external clock signal CLK.

The semiconductor device 100 is provided with at least a clock terminal 101, address terminals 102, command terminals 103, and data input/output terminals 104 as external terminals. The clock terminal 101 is a terminal to which the external clock signal CLK is inputted, and the inputted external clock signal CLK is supplied to the controller 120 and the DLL circuit 200. The address terminals 102 and the command terminals 103 are terminals receiving an address signal ADD and a command signal CMD, respectively; and the address signal ADD and the command signal CMD are supplied to the controller 120.

When the command signal CMD indicates a read operation, the controller 120 accesses the data stored in the memory cell array 110 at the address indicated by the address signal ADD, and supplies this data to the output buffer 130. Read data DQ, which is supplied to the output buffer 130, is outputted from the data input/output terminal 104 in synchronization with the external clock signal CLK, based on a control from the DLL circuit 200. On the other hand, when the command signal CMD indicates a write operation, write data DQ inputted to the data input/output terminal 104 is imported via the input buffer 140, and stored to the address indicated by the address signal ADD.

These actions performed by the controller 120 are carried out in synchronization with various internal clocks (not shown) generated on the basis of the external clock signal CLK.

The circuit structure of the DLL circuit 200 will be described below.

As shown in FIG. 1, the DLL circuit 200 according to the present embodiment has a coarse delay line (differential delay line) 210 and a fine delay line (interpolator) 220 for delaying the external clock signal CLK. The coarse delay line 210 is a delay line in which the pitch for adjusting the delay value is relatively large. The fine delay line 220 is a delay line in which the pitch for adjusting the delay value is relatively small. The delay operations carried out by the delay lines 210, 220 are controlled by a control circuit including a first controller 300 and a second controller 400.

As will be described in detail below, the coarse delay line 210 has a plurality of cascade-connected variable delay elements, and the delay value of a single variable delay element can be adjusted by the bias current. The bias current is set by the first controller 300 shown in FIG. 1. The output-producing variable delay element is selected from the plurality of cascade-connected variable delay elements by the second controller 400. In other words, the DLL circuit 200 according to the present embodiment has a dual-loop structure including a loop for controlling the delay value of a single variable delay element (first control loop); and a loop for controlling the number of variable delay elements to be used (second control loop).

Figure 2:
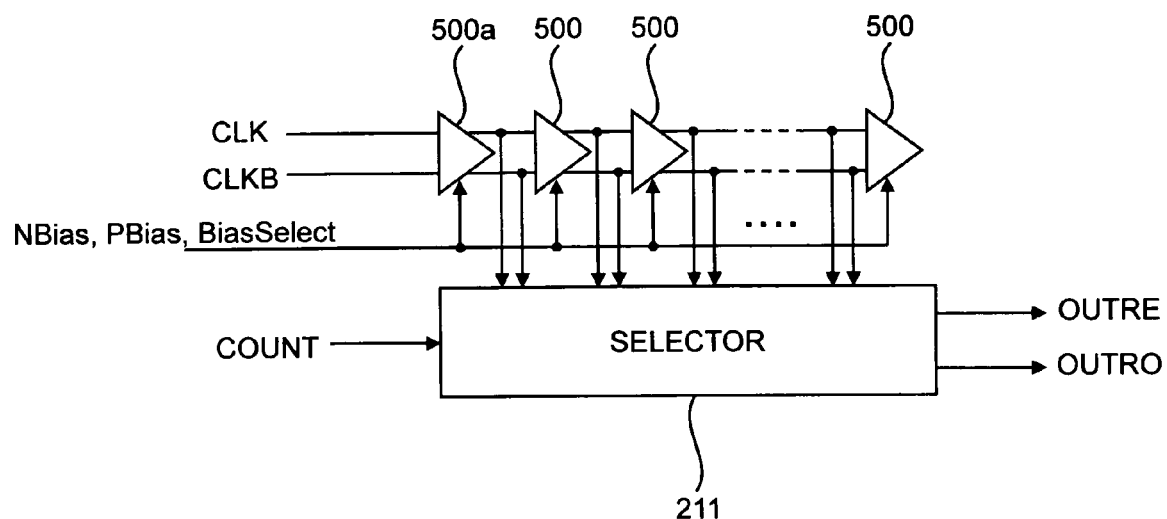
FIG. 2 is a block diagram showing the structure of the coarse delay line.

FIG. 2 is a block diagram showing the structure of the coarse delay line 210.

As shown in FIG. 2, the coarse delay line 210 has a plurality of cascade-connected variable delay elements 500, and the external clock signal CLK is supplied to the first stage variable delay element 500a. A selector 211 selects which among the plurality of variable delay elements 500 is the delay element from which the output is to be obtained.

The variable delay elements 500 have a differential circuit structure, and complementary signals (CLK, CLKB) are used for the input signal and the output signal. Therefore, the variable delay elements will not be readily affected by noise, and the delay value will only fluctuate minimally with respect to fluctuations in the power supply voltage.

Figure 3:
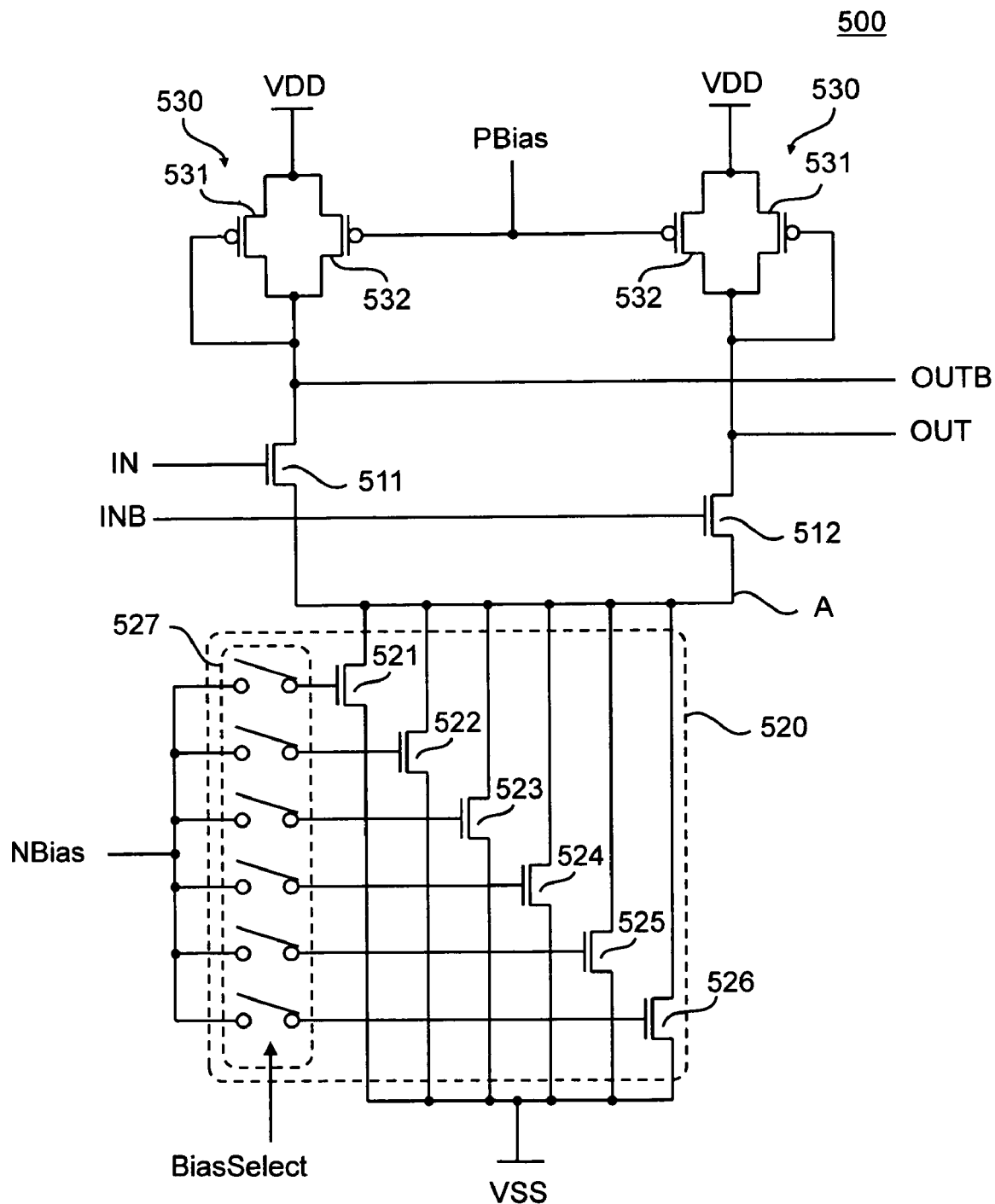
FIG. 3 is a circuit diagram of the variable delay elements.

FIG. 3 is a circuit diagram of the variable delay elements 500.

As shown in FIG. 3, the variable delay elements 500 have first and second input transistors 511, 512 whose sources are connected to a common node A; a variable bias circuit 520 connected between the common node A and power line VSS; and a load circuit 530 connected between the drains of the input transistors 511, 512 and a power line VDD.

The first and second input transistors 511, 512 are both N-channel MOS transistors, and complementary clock signals (IN, INB) are supplied in a differential format to the gate electrodes of the transistors. Complementary clock signals (OUTB, OUT) are outputted in a differential format from the drains of the input transistors 511, 512. A prescribed period of time must pass from the time the clock signals IN, INB have been inputted until the time the clock signals OUT, OUTB have been outputted. This period of time is the delay value of the variable delay elements 500. The delay value of the variable delay elements 500 can be adjusted by the variable bias circuit 520.

The variable bias circuit 520 has a plurality of bias transistors 521 to 526, which are connected in parallel; and a switching circuit 527 for selecting the bias transistors to be activated. The bias transistors 521 to 526 are all N-channel MOS transistors, and a first bias voltage NBias is supplied to the gate electrodes of the bias transistors via the switching circuit 527.

Although there are no particular limitations, at least some of the bias transistors 521 to 526 preferably have mutually differing channel widths. For example, the channel widths of the bias transistors 521 to 526 may be set to 3 μm, 3 μm, 2 μm, 1 μm, 0.5 μm, and 0.4 μm, respectively. If at least some of the transistors have different channel widths, the range over which the bias current can be adjusted can be increased according to the combination of selected bias transistors 521 to 526.

The switching circuit 527 is controlled by using a bias selection signal BiasSelect. The bias selection signal BiasSelect and a bias voltage NBias are supplied from the first controller 300. The bias selection signal BiasSelect is a digital format signal.

The load circuit 530 has first and second load transistors 531, 532, which are connected in parallel. The load transistors 531, 532 are both P-channel MOS transistors. The first load transistor 531 is diode connected, and a second bias voltage PBias is supplied to the gate electrode of the second load transistor 532. The second bias voltage PBias is also supplied from the first controller 300.

According to this configuration, the delay value of the variable delay elements 500 can be varied by both the bias voltage NBias and the bias selection signal BiasSelect. Specifically, if the number of selected bias transistors 521 to 526 is reduced, or if the bias voltage NBias is reduced, the bias current will be reduced, causing the delay value of the variable delay elements 500 to increase. On the other hand, if the number of selected bias transistors 521 to 526 is increased, or if the bias voltage NBias is increased, the bias current will increase, causing the delay value of the variable delay elements 500 to decrease.

A case is presented by way of example wherein the total channel width of the energized bias transistors 521 to 526 is set within a range of 1 μm to 10 μm, and the bias voltage NBias is set within a range of 0.6 V to 0.8 V. The minimum delay value (channel width=10 μm; bias voltage NBias=0.8 V) is approximately 67.5 ps, and the maximum delay value (channel width=1 μm; bias voltage NBias=0.6 V) is 625 ps. In this example, the difference between the minimum delay value and the maximum delay value is approximately tenfold, which is an extremely large range for adjustment.

Furthermore, the delay value can be digitally adjusted since the bias selection signal BiasSelect is a digital format signal. Therefore, control can be more readily carried out in comparison to a case in which the delay value is adjusted in an analog fashion.

The number of stages in the variable delay elements 500 shown in FIG. 2 is not particularly limited, and may be considerably lower than the number used in a convention delay line. This is because the delay value in a single variable delay element 500 may be adjusted within a wide range, as has been described above. Therefore, the amount of area used on the chip can be reduced, and a wide range of clock frequencies can be handled. Furthermore, the quality of the clock signal transmitted by the delay line can be increased since complementary clock signals are used.

Figure 4:
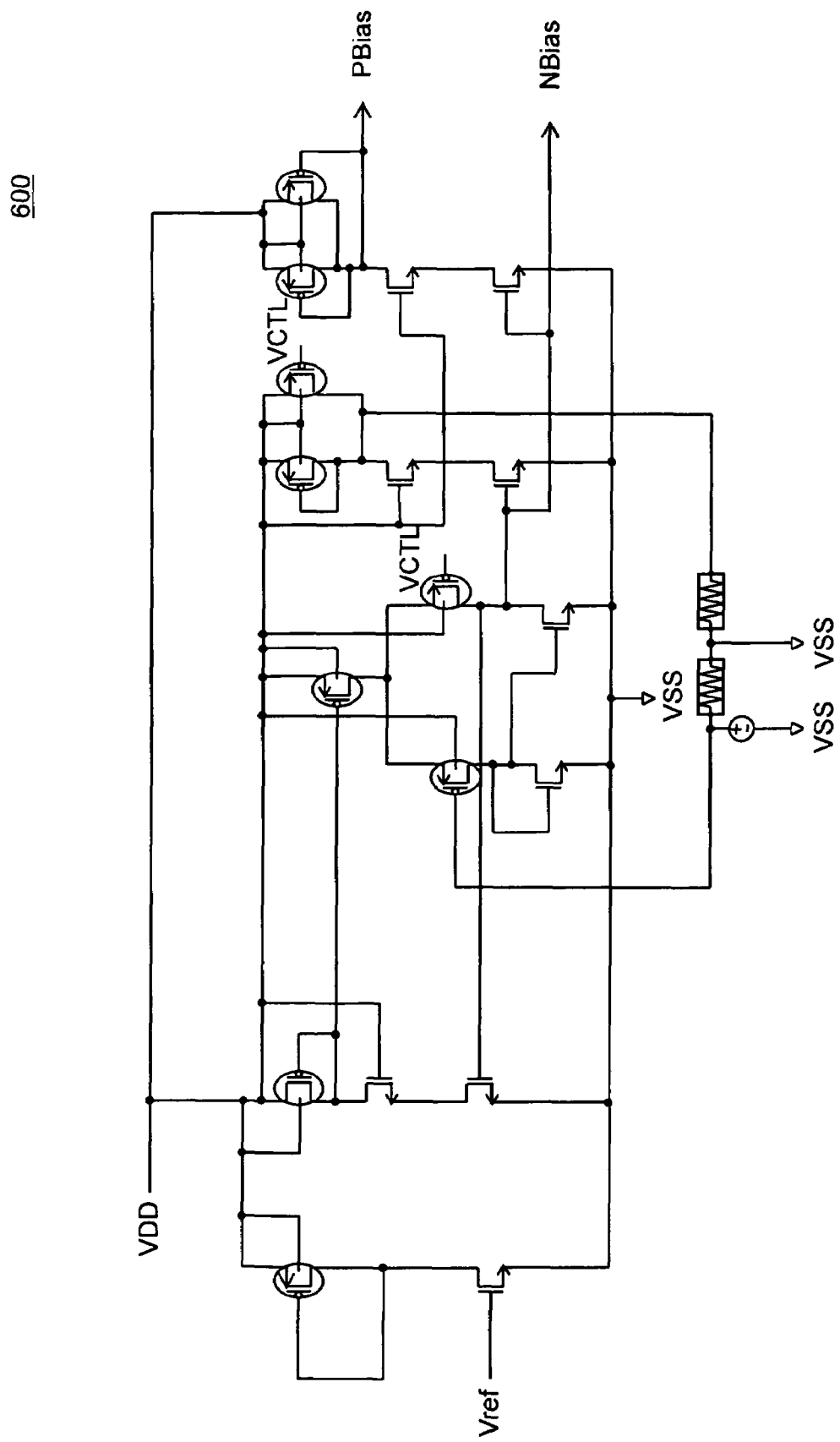
FIG. 4 is a circuit diagram of the bias generator.

Although there are no particular limitations, a bias generator 600 shown in FIG. 4 can be used for the first and second bias voltages NBias, PBias. The bias generator 600 shown in FIG. 4 is an auto-bias generator, wherein the second bias voltage PBias follows fluctuations in the power source voltage. The load characteristics of the load circuit 530 included in the variable delay elements 500 thereby fluctuate according to fluctuations in the power source voltage. On the other hand, the first bias voltage NBias does not follow fluctuations in the power source voltage, and maintains a substantially constant value. As a result, the delay value of the variable delay elements 500 can be kept constant using the bias generator 600 shown in FIG. 4.

In an ordinary delay line, a regulator is sometimes used in order to prevent fluctuations in the delay value caused by fluctuations in the power source voltage. However, the regulator occupies a large area on the chip, and consumes a large amount of power. Conversely, a regulator is not necessary in the present embodiment because the delay value is kept substantially constant even when fluctuations occur in the power source voltage.

A reference voltage Vref is used in the bias generator 600 shown in FIG. 4. The reference voltage Vref is generally used in a DRAM, and is already present inside the DRAM. Therefore, an additional circuit does not need to be provided for generating the reference voltage Vref.

Returning back to FIG. 1, the first controller 300 includes a ring oscillator 310, a clock frequency counter 320, and a delay setting circuit 330. The bias generator 600 shown in FIG. 4 constitutes a part of the delay setting circuit 330.

The ring oscillator 310 is a circuit for generating a reference clock CLKRef having a predetermined frequency, and the resulting reference clock CLKRef is supplied to the clock frequency counter 320. The clock frequency counter 320 is a circuit for counting the external clock signals CLK on the basis of the reference clock CLKRef, and thereby detecting the frequency of external clock signal CLK. The result is supplied to the delay setting circuit 330, and the delay setting circuit 330 sets the delay characteristics of the coarse delay line 210 on the basis of the result. The method for setting the delay characteristics, as described above, is carried out by varying the bias current supplied to the variable delay elements 500 using the first bias voltage NBias and/or the bias selection signal BiasSelect.

The second controller 400 has a phase comparator 410 for comparing the phase of the external clock signal CLK and an internal clock signal RCLK; and a counter circuit 420 for adding to or subtracting from the count value on the basis of the phase comparison results obtained by the phase comparator 410.

As shown in FIG. 1, the internal clock signal RCLK is an output signal from a replica buffer 440. The replica buffer 440 is a circuit that has substantially the same circuit structure as the output buffer 130, and operates in synchronization with internal clock signals LCLKOET, LCLKOEB, which are generated by the coarse delay line 210 and the fine delay line 220. Therefore, the internal clock signal RCLK, which is output by the replica buffer 440, is completely synchronized with the timing at which the read data DQ is output by the output buffer 130.

The phase comparator 410 compares the phases of the internal clock signal RCLK and the external clock signal CLK thus generated. The count value of the counter circuit 420 is undergoes addition or subtraction depending on which of the phases is advanced. The count value COUNT (CDL count value) from the counter circuit 420 is supplied to the selector 211 shown in FIG. 2, and the selector 211 selects the output-producing variable delay elements 500 on the basis of the count value COUNT. The external clock signal CLK and internal clock signal RCLK are thereby substantially synchronized by the coarse delay line 210.

As shown in FIG. 1, the output of the coarse delay line 210 is supplied to the fine delay line 220. As described above, the fine delay line 220 is a delay line in which the minimum pitch at which the delay value is adjusted is relatively small, and the external clock signal CLK and the internal clock signal RCLK are thereby accurately synchronized. The operation of the fine delay line 220 is controlled by an output from a bias circuit 430 on the basis of the count value (FDL count value) from the counter circuit 420.

The structure of the DLL circuit 200 according to the present embodiment was described above. The operation of the DLL circuit 200 will be described below.

Figure 5:
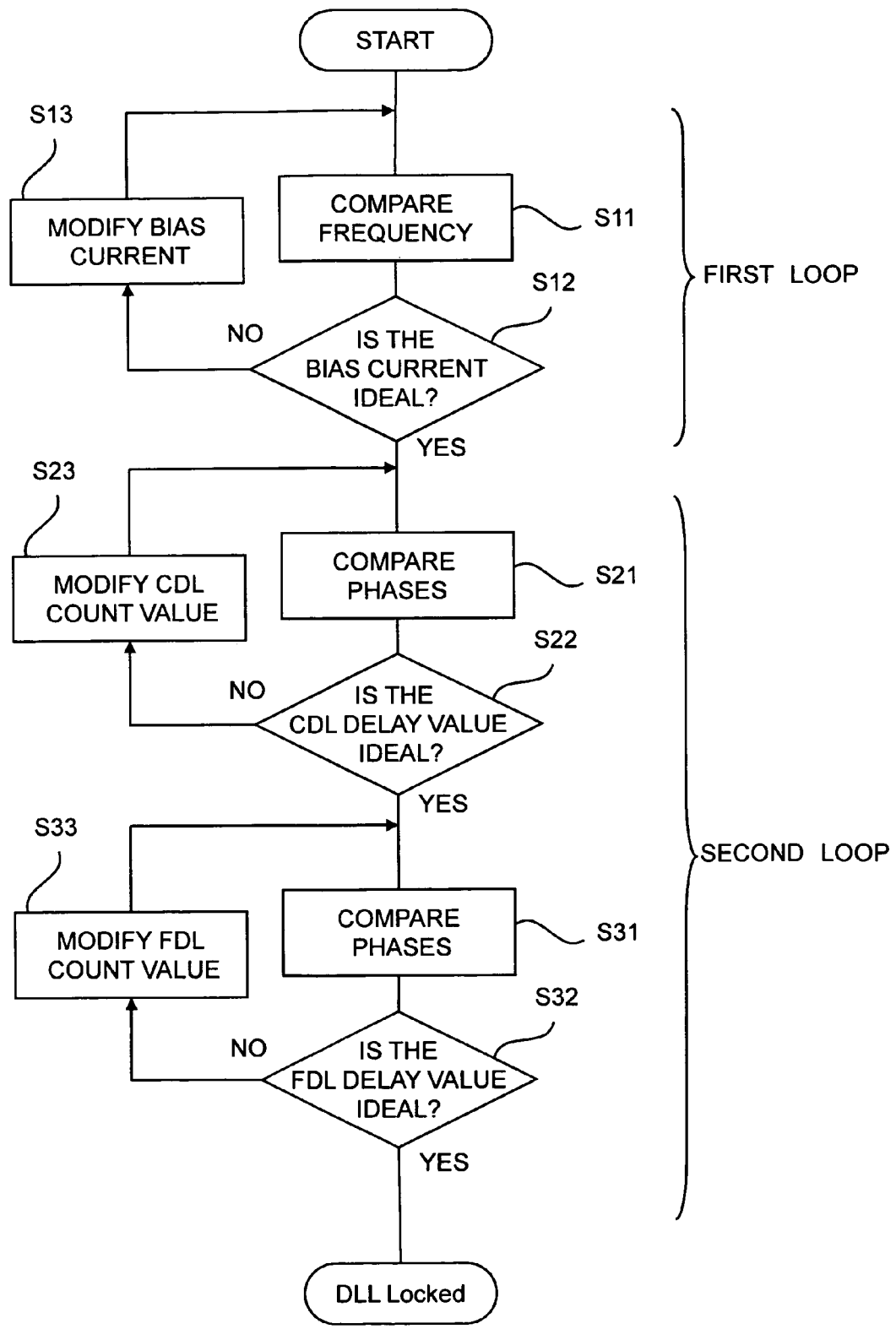
FIG. 5 is a flowchart showing the operation of the DLL circuit according to the preferred embodiment of the present invention.
Figure 6:
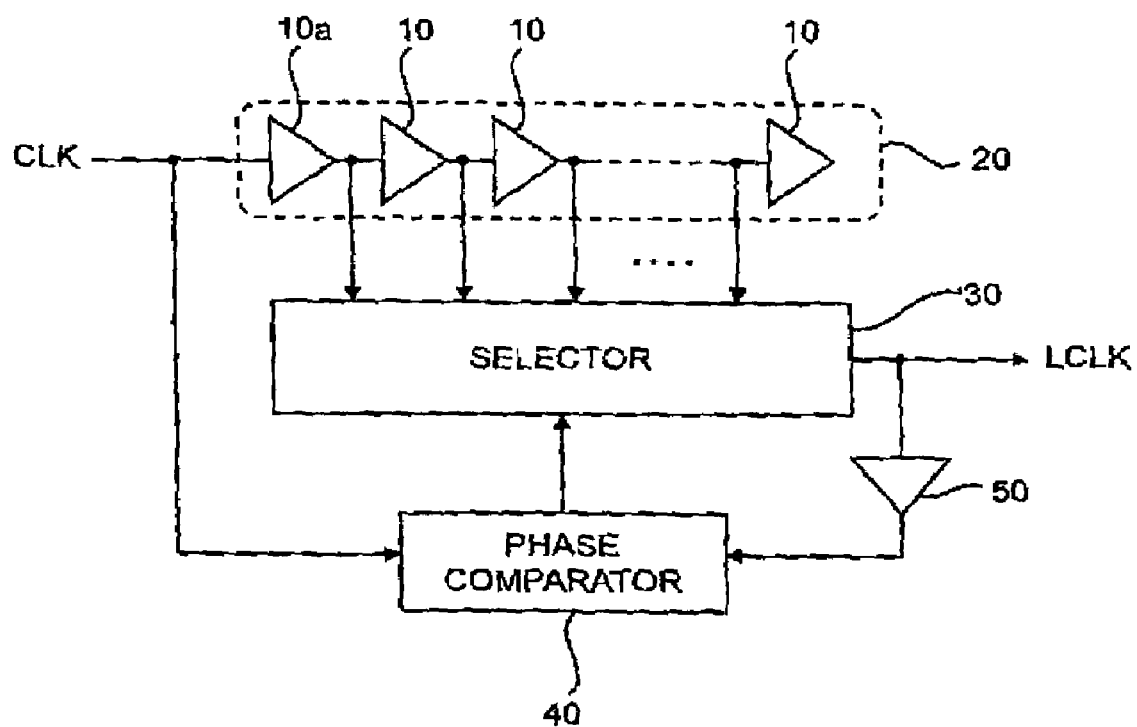
FIG. 6 is a circuit diagram of an ordinary DLL circuit.

FIG. 5 is a flowchart showing the operation of the DLL circuit 200 according to the present embodiment.

As shown in FIG. 5, the operation of the DLL circuit 200 according to the present embodiment includes a first control loop and a second control loop. The first control loop is a control loop for setting the bias current supplied to the variable delay elements 500 constituting the coarse delay line 210. Specifically, the first control loop is an operation for setting the delay value of each of the variable delay elements 500. The second control loop is a control loop that is executed after the first control loop, and is an operation for setting the delay value of the entirety of the coarse delay line 210 and the fine delay line 220.

In the first control loop, first, the clock frequency counter 320 is used to compare the frequencies of the reference clock CLKRef and the external clock signal CLK. The delay setting circuit 330 is controlled on the basis of the comparison results (step S11). A bias current based on the first bias voltage NBias and the bias selection signal BiasSelect is supplied to each of the variable delay elements 500 that constitute the coarse delay line 210.

The phase comparator 410 is then used to detect whether the resulting bias current is ideal. If the bias current is ideal (step S12: YES), the first control loop concludes, and the operation proceeds to the second control loop. If the bias current is not ideal (step S12: NO), the bias current is modified (step S13). As described above, the bias current can be modified by modifying the bias voltage NBias and/or the bias selection signal BiasSelect. The ideal bias current is set by repeating this process. Specifically, the delay values of each of the variable delay elements 500 can be set to ideal values.

The control of the coarse delay line 210 and control of the fine delay line 220 are performed in the stated order in the second control loop. In the control of the coarse delay line 210, the phase comparator 410 is used to compare the phases of the external clock signal CLK and the internal clock signal RCLK (step S21). The count value COUNT (CDL count value) from the counter circuit 420 is subjected to addition or subtraction (step S23) until the delay value of the coarse delay line 210 reaches an ideal value (step S22: YES). The external clock signal CLK and the internal clock signal RCLK are substantially synchronized by repeating this process.

When the delay value of the coarse delay line 210 has been set, the control of the fine delay line 220 is then carried out. In the control of the fine delay line 220, the phase comparator 410 is used to compare the phases of the external clock signal CLK and the internal clock signal RCLK (step S31). The count value (FDL count value) from the counter circuit 420 is subjected to addition or subtraction (step S33) until the delay value of the fine delay line 220 reaches an ideal value (step S32: YES). The external clock signal CLK and the internal clock signal RCLK are substantially synchronized by repeating this process.

As described above, the delay values of each of the variable delay elements 500 constituting the coarse delay line 210 are varied in the DLL circuit 200 according to the present embodiment. Therefore, a wide range of clock frequencies can be handled using a small number of stages. As a result, the area used on the chip can be reduced to a greater extent than in a conventional DLL circuit.

Furthermore, the bias current can be digitally modified because the variable delay elements 500 have a variable bias circuit 520 having bias transistors 521 to 526, which are connected in parallel. Therefore, control can be performed in a more streamlined manner relative to when the bias current is modified in an analog fashion.

The present invention is in no way limited to the aforementioned embodiments, but rather various modifications are possible within the scope of the invention as recited in the claims, and naturally these modifications are included within the scope of the invention.

For example, in the embodiment described above, the variable delay elements 500 are used in the coarse delay line 210, but may also be used in the fine delay line 220.

The present invention is not limited to DRAM applications, and may be used in other types of semiconductor devices.

What is claimed is:

1. A DLL circuit comprising:
   a delay line for delaying a clock signal, the delay line including a plurality of cascade-connected variable delay elements, the variable delay elements having a differential circuit structure in which a delay value thereof can be varied by a bias current, the variable delay elements comprising a plurality of bias transistors and a switching circuit connected to a gate of the plurality of bias transistors;
   a first controller for setting the bias current by controlling the switching circuit to select a bias transistor of the plurality of bias transistors; and
   a second controller for selecting an output-producing variable delay element from the plurality of the variable delay elements, the second controller including:
      a phase comparator for comparing a phase of the clock signal and an internal clock signal delayed by the delay line; and
      a counter circuit for performing addition or subtraction based on a results of a phase comparison by the phase comparator, and
   an other delay line which receives an output of the delay line, the other delay line having a pitch for adjusting the delay value which is less that a pitch for adjusting a delay value of the delay line,
   wherein the second controller further comprises a bias circuit for controlling the other delay line based on the count value from the counter circuit.

2. The DLL circuit as claimed in claim 1, wherein
   the variable delay elements include first and second input transistors comprising sources which are connected to a common node, and a variable bias circuit connected between the common node and a first power line; and
   the clock signal is supplied in differential format to a gate of the first and second input transistor, and the clock signal is output in differential format from drains of the first and second input transistors.

3. The DLL circuit as claimed in claim 2, wherein the variable bias circuit includes the plurality of bias transistors connected in parallel, and the switching circuit for selecting the bias transistors to be activated.

4. The DLL circuit as claimed in claim 3, wherein the switching circuit comprises a switch which is connected to the gate of a bias transistor of the plurality of bias transistors.

5. The DLL circuit as claimed in claim 3, wherein the first controller varies a first bias voltage supplied to gates of the bias transistors.

6. The DLL circuit as claimed in claim 2, wherein
the variable delay elements further have load circuits connected between the drains of the first and second input transistor and a second power line; and
the load circuits include first and second load transistors connected in parallel, the first load transistor has a diode connection, and a second bias voltage is supplied to a gate of the second load transistor.

7. The DLL circuit as claimed in claim 6, wherein the second bias voltage follows a variations of a power voltage supplied to the second power line.

8. The DLL circuit as claimed in claim 1, wherein the plurality of bias transistors have mutually differing channel widths and are connected in parallel.

9. A DLL circuit comprising:
a delay line for delaying a clock signal, the delay line including a plurality of cascade-connected variable delay elements, the variable delay elements having a differential circuit structure in which a delay value thereof can be varied by a bias current, the variable delay elements comprising a plurality of bias transistors and a switching circuit connected to a gate of the plurality of bias transistors;
a first controller for setting the bias current by controlling the switching circuit to select a bias transistor of the plurality of bias transistors; and
a second controller for selecting an output-producing variable delay element from the plurality of the variable delay elements,
wherein the gate of the plurality of bias transistors comprises a plurality of gates and the switching circuit comprises a plurality of switches connected to the plurality of gates, respectively, and the first controller generates a bias voltage which is supplied to the plurality of gate electrodes via the plurality of switches,
wherein the first controller generates a digital bias selection signal for controlling the switching circuit, and varies the delay value of the plurality of variable delay elements by varying at least one of the bias voltage and the bias selection signal, and
wherein the first controller comprises:
a ring oscillator for generating a reference clock;
a clock frequency counter which counts the external clock signals based on the reference clock to detect a frequency of the external clock; and
a delay setting circuit for setting delay characteristics of the delay line based on the frequency of the external clock.

10. The DLL circuit as claimed in claim 9, wherein the delay setting circuit comprises a bias generator for generating the bias voltage based on a reference voltage.

11. A semiconductor device comprising:
a delay line supplied with a clock signal at an input node and producing a delayed clock signal at an output node, the delay line including a plurality of variable delay elements electrically coupled in series, each of the variable delay elements providing a variable delay value that is controlled by a bias current flowing therethrough, at least one of the variable delay elements electrically connected between the input and output nodes;
a reference clock generator generating a reference clock signal independently of each of the clock signal and the delayed clock signal; and
a first controller responding to the clock signal and the reference clock signal to control the bias current flowing through each of the variable delay elements.

12. The semiconductor device as claimed in claim 11, wherein the reference clock generator comprises a ring oscillator.

13. The semiconductor device as claimed in claim 12, wherein the first controller comprises a clock frequency counter that counts clock pulses of the clock signal based on the reference clock signal to detect a frequency of the clock signal and a delay setting circuit that sets the bias current of the variable delay elements based on the frequency of the clock signal.

14. The semiconductor device as claimed in claim 11, further comprising a second controller which responds to the clock signal and a replica clock signal relative to the delayed clock signal to determine a number of the variable delay elements to be electrically connected in series between the input and output nodes.

* * * * *